(12) United States Patent
Wu et al.

(10) Patent No.: US 8,184,202 B2
(45) Date of Patent: May 22, 2012

(54) DISPLAY APPARATUS AND PHASE DETECTION METHOD THEREOF

(75) Inventors: Shang-Hsiu Wu, Hsinchu County (TW); Kuo-Chi Chen, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 617 days.

(21) Appl. No.: 12/372,715

(22) Filed: Feb. 17, 2009

(65) Prior Publication Data

US 2010/0002143 A1    Jan. 7, 2010

(30) Foreign Application Priority Data

Jul. 2, 2008 (TW) .............................. 97124927 A (51) Int. Cl.
    *H03M 1/12* (2006.01)
(52) U.S. Cl. .................. 348/572; 348/536; 348/739
(58) Field of Classification Search .......... 348/536–537, 348/539–540, 505–506, 508, 516–517, 521, 348/500, 497–499, 512–514, 607, 572, 739; H03M 1/12; H04N 5/66
    See application file for complete search history.

(56) References Cited

U.S. PATENT DOCUMENTS

| | | | |
|---|---|---|---|
| 5,742,191 A * | 4/1998 | Romesburg et al. | 327/156 |
| 6,014,176 A * | 1/2000 | Nayebi et al. | 348/539 |
| 7,391,416 B2 * | 6/2008 | Yearim | 345/213 |
| 7,502,076 B2 * | 3/2009 | Xiu et al. | 348/572 |
| 7,649,569 B2 * | 1/2010 | Chang et al. | 348/512 |
| 7,719,529 B2 * | 5/2010 | Anderson et al. | 345/213 |

FOREIGN PATENT DOCUMENTS

KR    2004-0016587    2/2004

OTHER PUBLICATIONS

"Office Action of Taiwan Counterpart Application", issued on Dec. 13, 2011, p. 1-p. 7, in which the listed reference was cited.

* cited by examiner

*Primary Examiner* — Trang U Tran
(74) *Attorney, Agent, or Firm* — Jianq Chyun IP Office (57) ABSTRACT

A display apparatus including an analog-to-digital converter (ADC) module, a phase detecting module, and a clock generator is provided. The ADC module is used to receive a first analog video signal, and convert the first analog video signal into a digital signal according to a clock signal. The first analog video signal includes a first synchronous information and a first video information. The phase detecting module is used to receive the digital signal, and output a phase adjustment signal according to a part of the digital signal corresponding to the first synchronous information. The clock generator is used to output the clock signal according to the phase adjustment signal.

9 Claims, 6 Drawing Sheets

DISPLAY APPARATUS AND PHASE DETECTION METHOD THEREOF

CROSS-REFERENCE TO RELATED APPLICATION

This application claims the priority benefit of Taiwan application serial no. 97124927, filed on Jul. 2, 2008. The entirety of the above-mentioned patent application is hereby incorporated by reference herein and made a part of specification.

BACKGROUND OF THE INVENTION

1. Field of the Invention

The present invention relates to a display apparatus, in particular, to a display apparatus having a phase detection function and a phase detection method thereof.

2. Description of Related Art

Along with the incoming of the information era, the mass is no longer satisfied with presenting the data information in the form of texts or static pictures when receiving and transmitting data information. Instead, high-quality flat display apparatuses are used to exhibit fine dynamic images.

Figure 1:
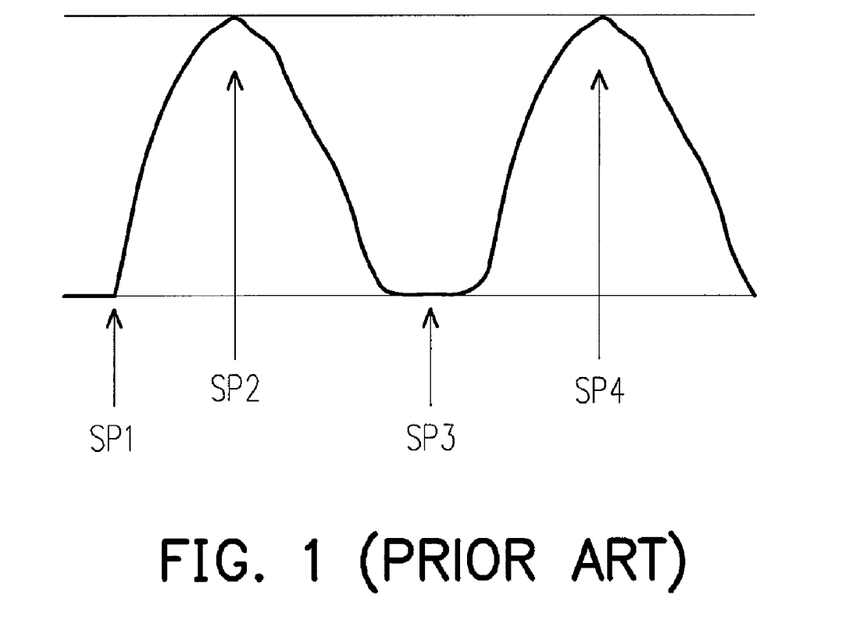
FIG. 1 is a waveform chart of a part of a video signal of a video graphics array (VGA) picture.

A conventional TV set is taken an example below, and when performing automatic phase detection on a received video graphics array (VGA) picture, the TV set performs calculations by using the characteristics of the VGA picture in the static state. FIG. 1 is a waveform chart of a part of a video signal of a VGA picture. The waveform in FIG. 1 represents an image with alternated black and white colours in the form of black, white, black, and white. It can be clearly seen from FIG. 1 that, in order to accurately capture the image information, the phase relation of the video signal must be detected accurately.

When the video information VO in the video signal of the VGA is sampled with a correct phase, the sampled pixels have great colour level differences. Therefore, the conventional automatic phase detection technique utilizes this feature, for example, various different phases are used to perform the sampling of the video information VO, so as to find out the phases that are capable of making the colour level differences STP1, STP2, STP3, and STP4 in the video signal become maximum, and the points STP1, STP2, STP3, and STP4 with the maximum colour levels are taken as the phases for all the video information, so as to sample the video information.

However, the images presented on the TV set are mostly dynamic, and seldom static. Therefore, the above conventional phase detection method cannot find out the obvious points with the maximum colour level differences to define the correct phases of all the video information. Therefore, the video information cannot be sampled correctly, which results in the distortion of displayed pictures.

SUMMARY OF THE INVENTION

Accordingly, the present invention is directed to a display apparatus, which is suitable for capturing a synchronous information of a received analog video signal, so as to perform phase detection, thereby effectively sampling a video information of the analog video signal.

The present invention is further directed to a phase detection method, which includes performing phase detection by using a synchronous information of an analog video signal in a TV system, so as to effectively sample a video information of the analog video signal.

A phase detection method is further provided in the present invention, suitable for being used in a display apparatus, which includes the following steps. First, a first analog video signal is received, and the first analog video signal is converted into a digital signal according to a clock signal. The first analog video signal includes a first synchronous information and a first video information. Then, a phase adjustment signal is generated according to a part of the digital signal corresponding to the first synchronous information. Finally, a clock signal is generated according to the phase adjustment signal.

In the present invention, the synchronous information in the analog video signal is used to perform the phase detection. Therefore, the delivery phase of the analog video signal can be detected more accurately and effectively, thereby correctly sampling the video information of the analog video signal.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

The display apparatus of the present invention is illustrated below in the following embodiments with reference to the accompanying drawings, and thus persons of ordinary skill in the art can further understand and implement the present invention.

Figure 2:
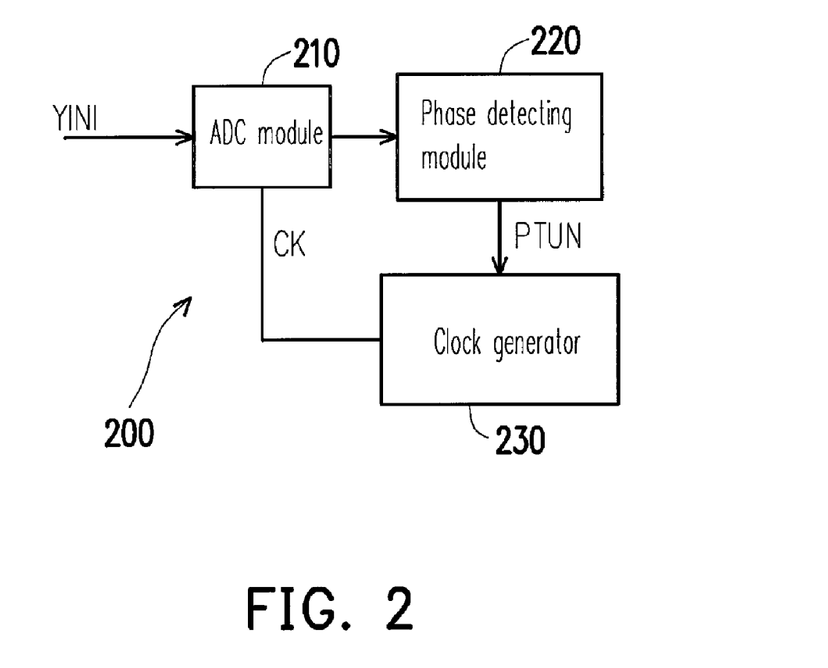
FIG. 2 is a schematic view of a display apparatus according to a first embodiment of the present invention.

FIG. 2 is a schematic view of a display apparatus according to a first embodiment of the present invention. Referring to FIG. 2, the display apparatus 200 includes an ADC module 210, a phase detecting module 220, and a clock generator 230. The ADC module 210 receives an analog video signal YIN1 from exterior, performs an analog-to-digital conversion on the analog video signal YIN1 according to a clock signal CK, and transfers the converted video signal in the digital format into the phase detecting module 220. The analog video signal YIN1 includes a synchronous information and a video information.

The phase detecting module 220 receives the digital signal generated by the ADC module 210, and performs phase detection on the video information according to a part of the digital signal corresponding to the synchronous information of the analog video signal YIN1. Furthermore, the phase detecting module 220 outputs a phase adjustment signal PTUN according to the detection result.

Figure 3A:
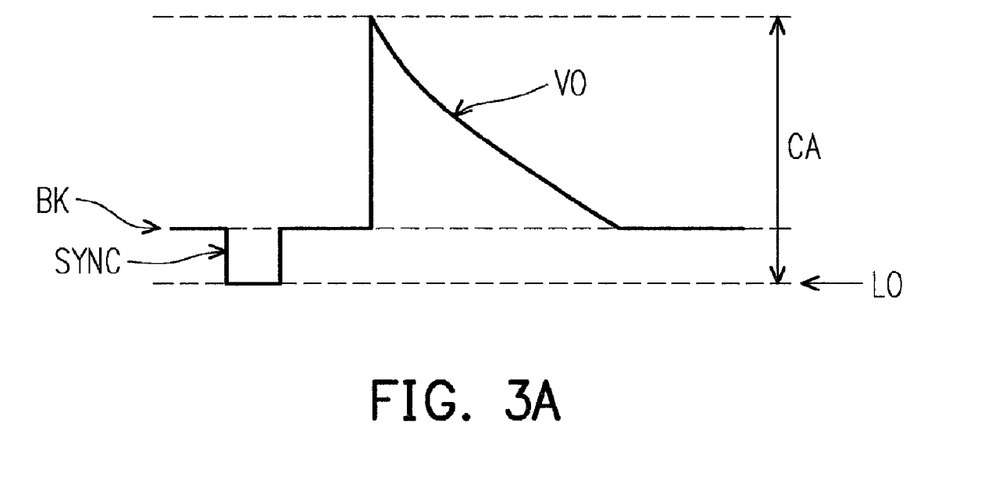
FIG. 3A~3C are schematic views of waveforms of an analog video signal YIN1.

Referring to FIGS. 2 and 3A~3C, FIG. 3A~3C are schematic view of waveforms of an analog video signal YIN1. As shown in FIG. 3A, the synchronous information SYNC is loaded at an initial end of the analog video signal YIN1, and located in a region with the lowest voltage LO. A plurality of batches of video information VO follows the synchronous information SYNC. The lowest point of the analog video signal YIN1 is the lowest voltage LO (corresponding to the synchronous information SYNC), and the lowest level of the video information is a black picture level BK, which indicates that when the video information is at the black picture level BK, the picture displayed by the display apparatus is a black picture.

It should be noted that, since the video information VO changes randomly in a dynamic image, the video information VO of the dynamic image is not suitable for being taken as the basis for phase detection. However, even for the dynamic image, the synchronous information SYNC remains unchanged. Therefore, the present invention adopts the synchronous information SYNC as an equivalent static picture to perform phase detection. The phase detection mechanism thereof is similar to the conventional phase detection mechanism, but it should be noted that, the phase detection mechanism of the present invention takes the synchronous information SYNC, instead of the video information, as the basis for detection.

Based on the above principles, the phase detecting module 220 merely needs to detect the digital value in the digital signal corresponding to the position of the synchronous information SYNC, thereby acquiring the current phase state, so as to achieve the phase detection motion and output the phase adjustment signal PTUN accordingly.

The clock generator 230 is capable of generating a plurality of clocks having different phases and selecting one of the clock according to the phase adjustment signal. That is, the clock generator 230 may be a phase locked loop (PLL) or a direct digital synthesis (DDS). The clock generator 230 receives the phase adjustment signal PTUN and adjusts a generated clock signal CK. In this manner, the ADC module 210 performs an analog-to-digital conversion on the analog video signal YIN1 by using the clock signal CK with a better phase, thereby obtaining a better digital signal for being used by a back-end circuit (not shown).

It should be noted that, in the conventional art, the ADC module built in the display apparatus is merely used to perform the analog-to-digital conversion on the video information. For example, since a voltage level of the video information is between the black picture level BK and the white picture level WE, the analog-to-digital conversion range of the conventional ADC module is between the black picture level BK and the white picture level WE (for example, the black picture level is converted into a digital value 0, and the white picture level WH is converted into a digital value 255). Those voltage levels beyond this range cannot be converted into digital values since they have exceeded the resolution range of the ADC module. However, referring to FIG. 3A, since the analog-to-digital conversion must be performed on the synchronous information in the present invention in order to perform the phase detection, the ADC module 210 of the present invention is required to have a larger analog-to-digital conversion range CA (at least achieving the resolution of the lowest voltage LO), so as to perform the analog-to-digital conversion on the synchronous information.

Figure 3B:
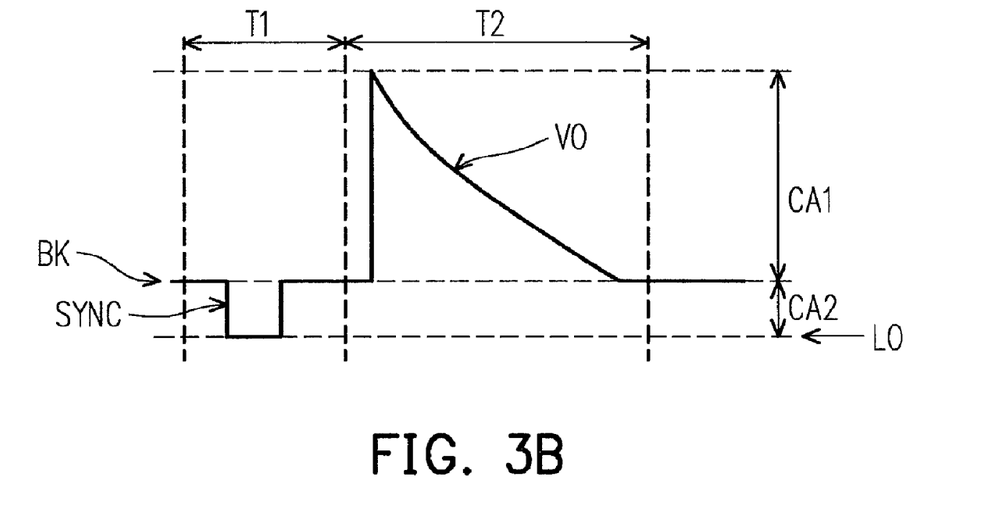

Alternatively, referring to FIG. 3B, the present invention can dynamically adjust the conversion range of the ADC module 210. For example, in the present invention, the conversion range of the ADC module 210 may be changed to the converting range CA2 when period T1 for converting the synchronous information, so as to achieve the resolution of the synchronous information. The ADC module 210 restores the original conversion range CA1 when period T2 for converting the video information. In this manner, the ADC module 210 can operate normally to perform the analog-to-digital conversion on the video information.

Figure 3C:
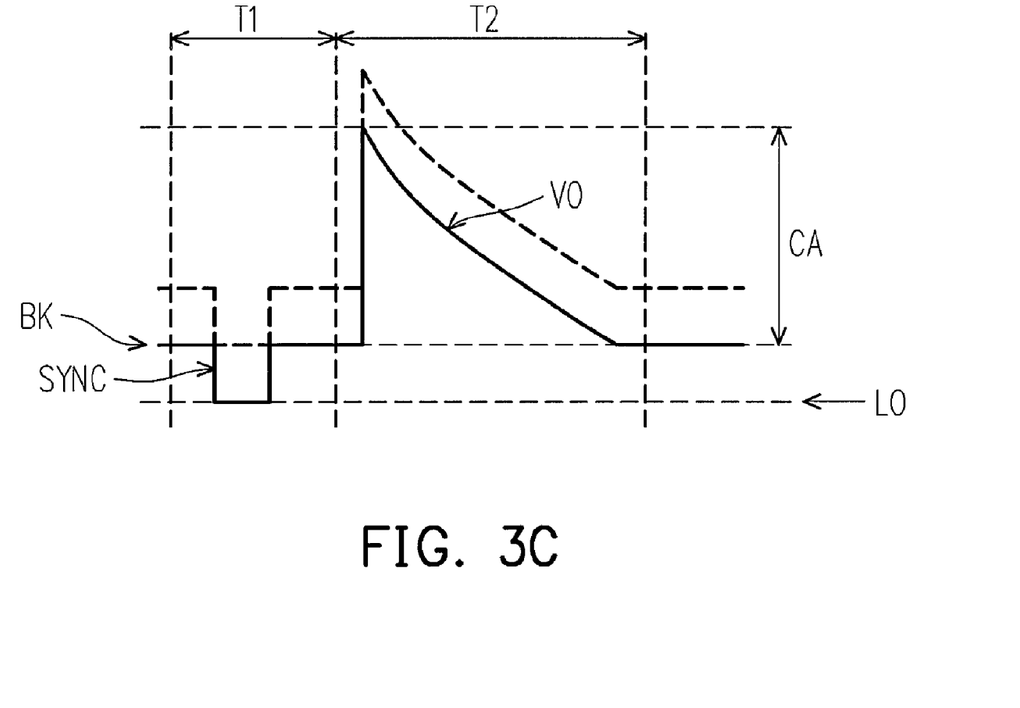

Furthermore, referring to FIG. 3C, the present invention can also process the synchronous information, so as to enable the ordinary ADC module 210 to perform the analog-to-digital conversion on the synchronous information without any modification. For example, the present invention may alter the level of the synchronous information, such that the synchronous information falls within the resolution range CA of the ADC module 210. For example, in the present invention, a level shifter is used to directly adjust the voltage level of the synchronous information, so that the voltage level thereof falls within the resolution range of the ADC module 210. Alternatively, in the present invention, an analog inverter is used to invert the synchronous information, so as to enable the synchronous information to fall within the resolution range of the ADC module 210. The corresponding changes will be described below.

Figure 4:
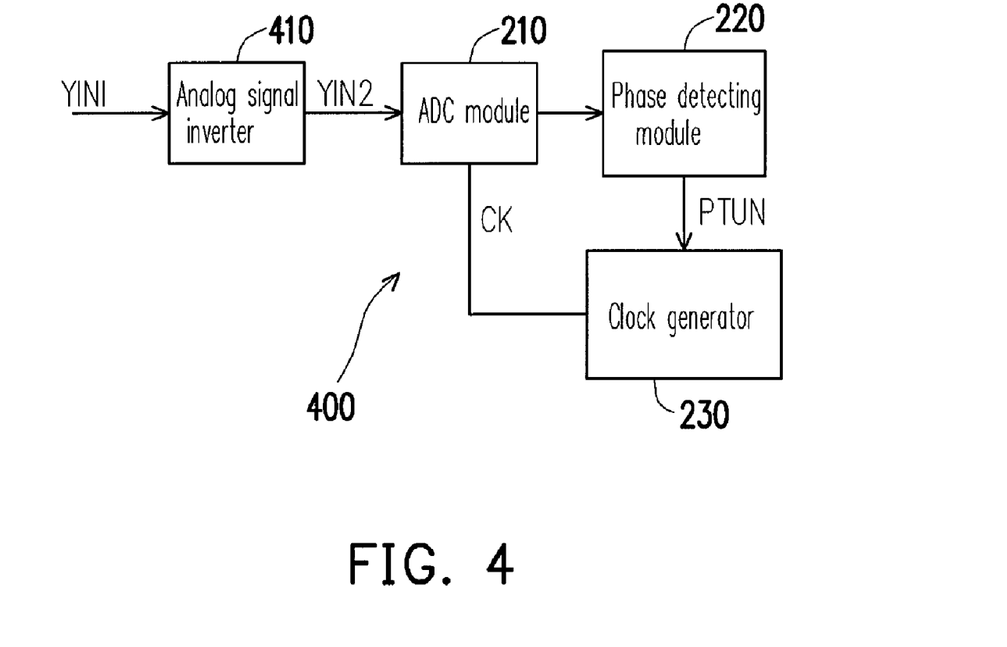
FIG. 4 is a schematic view of a display apparatus according to a second embodiment of the present invention.

FIG. 4 is a schematic view of a display apparatus 400 according to a second embodiment of the present invention. Referring to FIG. 4, different from the display apparatus 200 in the first embodiment, the display apparatus 400 further has an analog signal inverter 410. The analog signal inverter 410 is used to invert the analog video signal YIN1 before it is converted into the digital format. Then, the inverted analog video signal YIN2 is performed with the analog-to-digital conversion.

Figure 5A:
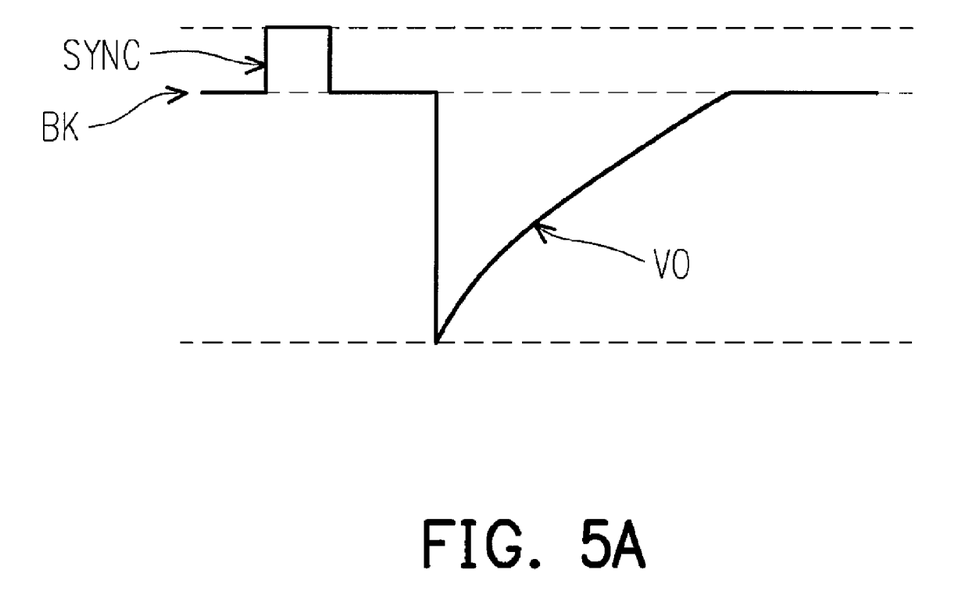
FIGS. 5A and 5B are respectively waveform charts of an inverted analog video signal YIN2.
Figure 5B:
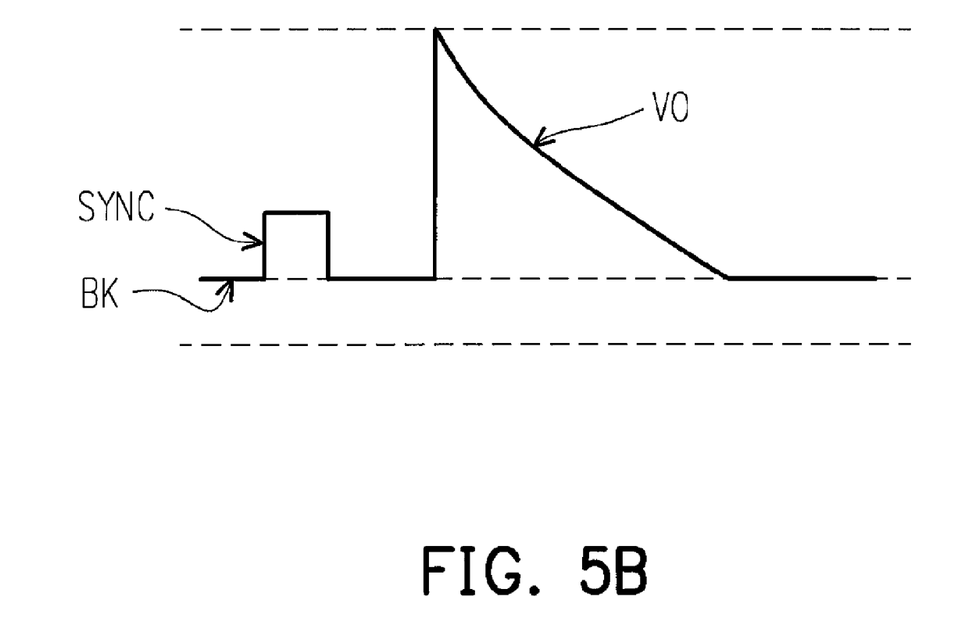

FIGS. 5A and 5B are respectively waveform charts of an inverted analog video signal YIN2. Referring to FIGS. 5A and 5B, FIG. 5A is a waveform chart after the entire analog video signal YIN1 is inverted, and FIG. 5B is a waveform chart after merely the synchronous information SYNC of the analog video signal YIN1 is inverted.

As described above, the synchronous information must be inverted, since the conversion range of the ADC module 210 is insufficient. In this way, the inverted synchronous information falls within the conversion range of the ADC module 210 (i.e., the inverted synchronous information is equivalent to a static picture), so as to avoid the incorrect phase detection caused by using the dynamic picture.

However, those skilled in the art may select to merely invert the synchronous signal or invert the entire analog video signal through the manner of FIG. 4 or FIG. 5, which is apparent for persons of ordinary skill in the art, and thus, the details will not be described herein again.

Figure 6:
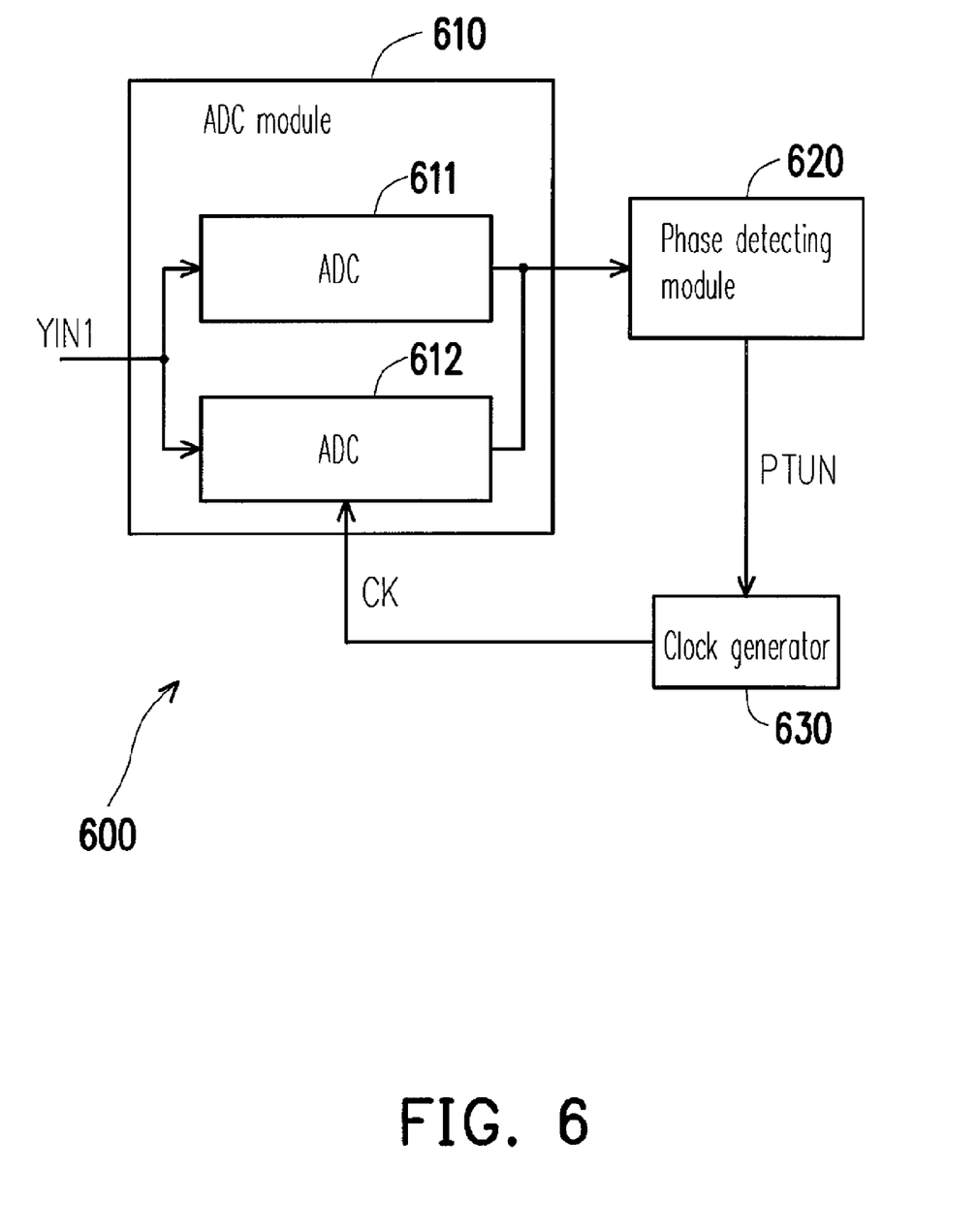
FIG. 6 is a schematic view of a display apparatus according to a third embodiment of the present invention.

FIG. 6 is a schematic view of a display apparatus according to a third embodiment of the present invention. Referring to FIG. 6, the display apparatus 600 includes an ADC module 610, a phase detecting module 620, and a clock generator 630. The ADC module 610 includes two ADCs 611 and 612. The two ADCs 611 and 612 are respectively used to perform the analog-to-digital conversion on the synchronous information and the video information of the analog video signal YIN1 received by the ADC module 610.

Herein, two ADCs are used because the synchronous information and the video information of the analog video signal YIN1 are at different voltage levels respectively. Therefore, two ADCs 611 and 612 are respectively designed to perform an analog-to-digital conversion on the synchronous information and video information in different ranges. As for the ADC 611 that performs the analog-to-digital conversion on the synchronous information, its output is provided to the phase detecting module 620 to perform the phase detection. The phase detecting module 620 generates a phase adjustment signal PTUN according to the phase detection result and provides the PTUN signal to the clock generator 630. Then, the clock generator 630 generates the clock signal CK according to the phase adjustment signal PTUN.

At this time, the ADC 612 performs the analog-to-digital conversion on the video information of the analog video signal YIN1 accurately according to the clock signal CK, so as to obtain the video information in the digital format.

It should be noted that, during the process of performing the analog-to-digital conversion on the analog video signal, the ADCs 611 and 612 may operate at different time. Particularly, when performing the analog-to-digital conversion on the synchronous information of the analog video signal, merely the ADC 611 is activated and the ADC 612 stops working, and when performing the analog-to-digital conversion on the video information, the ADC 611 stops working.

Hereinafter, an embodiment of the phase detection method suitable for being used in a display apparatus according to the present invention is described below for illustrating the details of the process.

Figure 7:
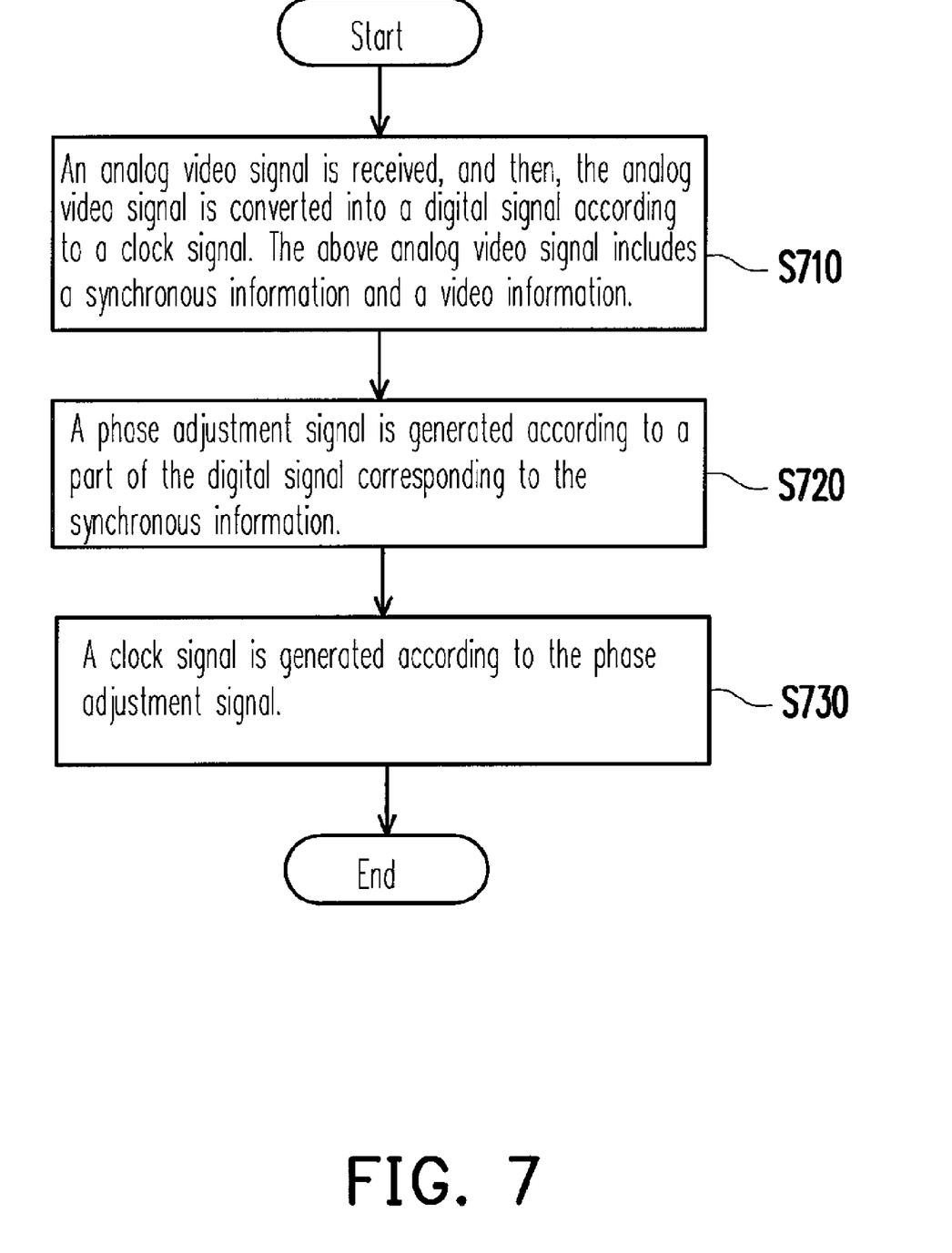
FIG. 7 is a flow chart of a phase detection method according to an embodiment of the present invention.

FIG. 7 is a flow chart of a phase detection method according to an embodiment of the present invention. Referring to FIG. 7, the method includes the following steps. First, an analog video signal is received, and then, the analog video signal is converted into a digital signal according to a clock signal. The above analog video signal includes a synchronous information and a video information (Step S710). Then, a phase adjustment signal is generated according to a part of the digital signal corresponding to the synchronous information (Step S720). Finally, the clock signal is generated according to the phase adjustment signal (Step S730).

Furthermore, the analog video signal in Step S710 may be obtained through inverting an analog video signal received from exterior (for example, inverting the received entire analog video signal, or merely inverting the synchronous information). The voltage level of the synchronous information carried by the analog video signal has been adjusted to fall within the processing range of the ADC module 210. The synchronous information of the analog video signal received from the exterior is corresponding to the synchronous information mentioned in Step S710.

It should be noted that, in the step of converting the analog video signal into the digital signal, the analog-to-digital conversion range may be changed depending upon the synchronous information or video information of the analog video signal, so as to perform corresponding analog-to-digital conversion.

It should be noted that, during the process of performing the analog-to-digital conversion on the analog video signal, when performing the analog-to-digital conversion on the synchronous information of the analog video signal, the analog-to-digital conversion on the video information is stopped. When performing the analog-to-digital conversion on the video information, the analog-to-digital conversion on the synchronous information is stopped.

To sum up, the present invention provides a display apparatus and a phase detection method, in which the synchronous information of the analog video signal is taken as the basis for phase detection, thereby correctly sampling the video information in the analog video signal, so as to improve the display quality.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A display apparatus, comprising:
   an analog-to-digital converter (ADC) module, for receiving a first analog video signal, and converting the first analog video signal into a digital signal according to a clock signal, wherein the first analog video signal comprises a first synchronous information and a first video information;
   a phase detecting module, coupled to the ADC module, for receiving the digital signal, and outputting a phase adjustment signal according to a part of the digital signal corresponding to the first synchronous information;
   a clock generator, coupled to the phase detecting module and the ADC module, for outputting the clock signal according to the phase adjustment signal; and
   an analog signal inverter, coupled to the ADC module, for receiving a second analog video signal from exterior, wherein the second analog video signal comprises a second synchronous information and a second video information, and the analog signal inverter at least inverts the second synchronous information of the second analog video signal, so as to generate the first analog video signal;
   wherein the second synchronous information corresponds to the first synchronous information.

2. The display apparatus according to claim 1, wherein the clock generator is capable of generating a plurality of clocks having different phases and selecting one of the clock according to the phase adjustment signal.

3. The display apparatus according to claim 1, wherein the ADC module changes an analog-to-digital conversion range, so as to perform the analog-to-digital conversion respectively on the synchronous information and the video information of the first analog video signal.

4. The display apparatus according to claim 1, wherein the ADC module comprises:
   a first ADC, for receiving the first analog video signal, and performing an analog-to-digital conversion on the video information of the first analog video signal; and
   a second ADC, for receiving the first analog video signal, and performing an analog-to-digital conversion on the synchronous information of the first analog video signal.

5. The display apparatus according to claim 4, wherein when the first ADC operates, the second ADC stops working, and when the first ADC operates, the second ADC stops working.

6. The display apparatus according to claim 1, further comprising:
   a level shifter, coupled to the ADC module, for receiving a second analog video signal from exterior, wherein the second analog video signal comprises a second synchronous information and a second video information, and the level shifter at least adjusts a voltage level of the second synchronous information of the second analog video signal, so as to generate the first analog video signal;
   wherein the second synchronous information corresponds to the first synchronous information.

7. The display apparatus according to claim 1, wherein the clock generator is a phase locked loop (PLL) or a direct digital synthesis (DDS).

8. A phase detection method, suitable for being used in a display apparatus, comprising:

receiving a first analog video signal, and converting the first analog video signal into a digital signal according to a clock signal, wherein the first analog video signal includes a first synchronous information and a first video information;

generating a phase adjustment signal according to a part of the digital signal corresponding to the first synchronous information;

generating the clock signal according to the phase adjustment signal; and receiving a second analog video signal comprising a second synchronous information and a second video information from exterior, and at least inverting the second synchronous information of the second analog video signal, so as to generate the first analog video signal;

wherein the second synchronous information corresponds to the first synchronous information.

9. The phase detection method according to claim 8, further comprising:

receiving a second analog video signal comprising a second synchronous information and a second video information from exterior, and at least adjusting a voltage level of the second synchronous information of the second analog video signal, so as to generate the first analog video signal;

wherein the second synchronous information corresponds to the first synchronous information.

* * * * *